(12) United States Patent
Lee et al.

(10) Patent No.: US 8,404,408 B2
(45) Date of Patent: Mar. 26, 2013

(54) MASK FOR SEQUENTIAL LATERAL SOLIDIFICATION AND SEQUENTIAL LATERAL SOLIDIFICATION APPARATUS HAVING THE SAME

(75) Inventors: Kwon-Hyung Lee, Yongin (KR); Cheol-Ho Park, Yongin (KR); In-Do Chung, Yongin (KR); Jae-Beom Choi, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 45 days.

(21) Appl. No.: 12/983,447

(22) Filed: Jan. 3, 2011

(65) Prior Publication Data

US 2011/0220904 A1    Sep. 15, 2011

(30) Foreign Application Priority Data

Mar. 11, 2010    (KR) ........................ 10-2010-0021834

(51) Int. Cl.
*H01L 21/44* (2006.01)
*H01L 21/20* (2006.01)

(52) U.S. Cl. .......................................... 430/5; 438/487

(58) Field of Classification Search .............. 430/5, 311; 438/166, 487
See application file for complete search history.

(56) References Cited

U.S. PATENT DOCUMENTS

2007/0184638 A1*    8/2007    Kang et al. ................. 438/487
2009/0203230 A1    8/2009    Park

FOREIGN PATENT DOCUMENTS

KR    2009-0087323    8/2009

\* cited by examiner

*Primary Examiner* — Stephen Rosasco
(74) *Attorney, Agent, or Firm* — H.C. Park & Associates, PLC (57) ABSTRACT

A mask for sequential lateral solidification (SLS) which is capable of preventing an overlapping region and a diagonal stain based on a crystallization pattern of an active layer. The mask for SLS, which moves in a first direction and selectively transmits a laser beam emitted by a laser emitting device, includes slits which are formed such that the width of a slit in the first direction is smaller than the width of the slit in a second direction, which is perpendicular to the first direction. Each of the slits is tilted by a predetermined angle with respect to the first direction.

15 Claims, 10 Drawing Sheets

MASK FOR SEQUENTIAL LATERAL SOLIDIFICATION AND SEQUENTIAL LATERAL SOLIDIFICATION APPARATUS HAVING THE SAME

CROSS-REFERENCE TO RELATED APPLICATION

This application claims the benefit of Korean Patent Application No. 10-2010-0021834, filed Mar. 11, 2010 in the Korean Intellectual Property Office, the disclosure of which is incorporated herein by reference.

BACKGROUND

1. Field

Aspects of the present invention relate to a mask for sequential lateral solidification (SLS) and a SLS apparatus having the same, and more particularly, to a mask for SLS, capable of preventing an overlapping region and a diagonal stain based on a crystallization pattern of an active layer.

2. Description of the Related Art

In an active matrix (AM) type organic light emitting display device, each pixel includes a pixel driving circuit. The pixel driving circuit includes a thin-film transistor (TFT) using silicon. Amorphous silicon (a-Si) or polycrystalline silicon (poly-Si) is used as the silicon constituting the TFT.

In the a-Si TFT used in the pixel driving circuit, a semiconductor active layer has a source, a drain, and a channel and is formed of a-Si. Thus, the a-Si TFT exhibits relatively low electron mobility below 1 $cm^2/Vs$. Therefore, the recent trend is to replace the a-Si TFT with a poly-Si TFT. As compared to the a-Si TFT, the poly-Si TFT exhibits relatively high electron mobility and excellent stability with respect to light irradiation. Therefore, it is highly appropriate to use a poly-Si TFT as an active layer in a driving and/or switching TFT of an active matrix (AM) organic light emitting display device.

Such a poly-Si may be fabricated by using various methods. The methods may be generally categorized into methods of directly depositing the poly-Si and methods of depositing a-Si and crystallizing the deposited a-Si.

Examples of the methods of directly depositing the poly-Si include chemical vapor deposition (CVD), photo CVD, hydrogen radical (HR) CVD, electron cyclotron resonance (ECR) CVD, plasma enhanced (PE) CVD, low pressure (LP) CVD, or the like. Examples of the methods of depositing the a-Si and crystallizing the deposited a-Si include solid phase crystallization (SPC), excimer laser crystallization (ELC), metal induced crystallization (MIC), metal induced lateral crystallization (MILC), sequential lateral solidification (SLS), or the like.

The SPC method is impractical because it is necessary to maintain a high temperature above 600° C. for an extended period of time. Although the ELC method has an advantage in terms of low-temperature crystallization, a laser beam is expanded by using optics, and thus uniformity is relatively low. Meanwhile, the MIC method may reduce the temperature of crystallization by depositing a metal thin-film on an a-Si surface and crystallizing the a-Si by using the metal thin-film as a crystallization catalyst. However, since an a-Si layer is polluted with a metal, a TFT formed of the a-Si layer according to the MIC method exhibits deteriorated characteristics, and crystals are relatively small and have non-uniform growth patterns.

The SLS is a method using the fact that grains of silicon grow in a direction perpendicular to a border surface between liquid-state silicon and solid-state silicon. The a-Si is crystallized by partially melting the a-Si by irradiating a laser beam through a particular portion of the a-Si using a mask and growing crystals from the border between the melted portion and portion not melted in the direction toward the melted portion. The SLS is being focused on as a method of fabricating a low temperature poly-Si.

Figure 1:
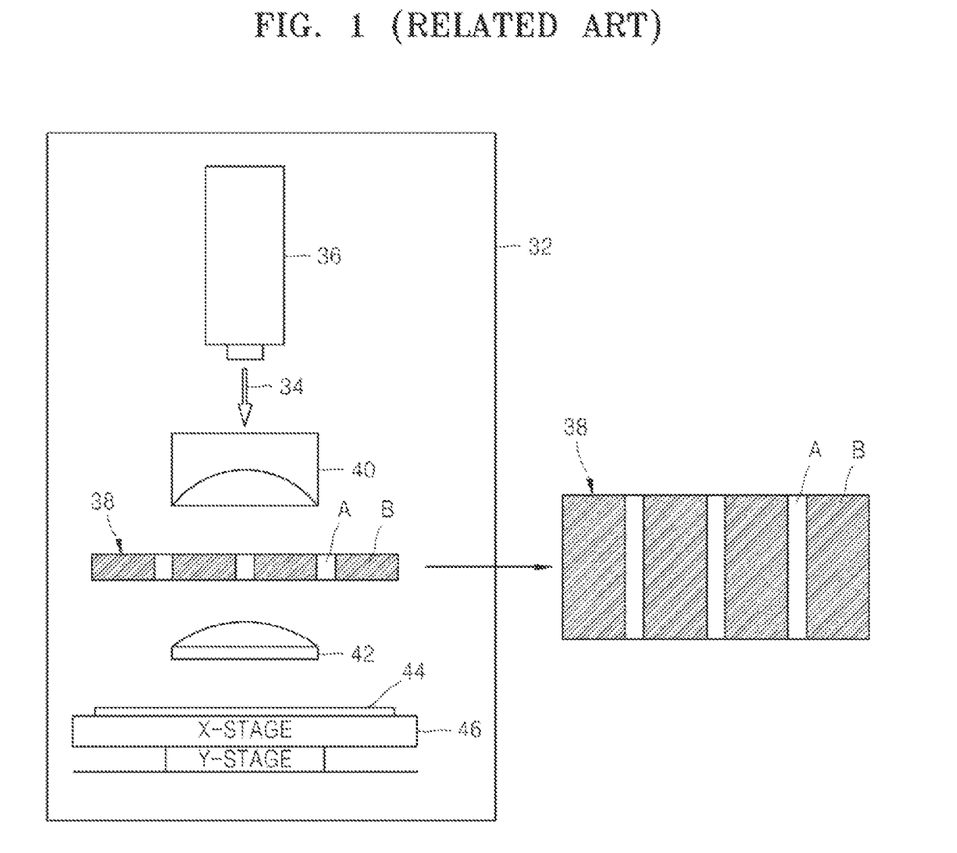
FIG. 1 shows sequential lateral solidification (SLS) equipment for performing SLS.

FIG. 1 shows SLS equipment 32 for performing SLS. The SLS equipment 32 includes a laser emitting device 36, a condensing lens 40, a mask 38, and a reduction lens 42. The laser emitting device 36 emits a laser beam 34. The condenser lens 40 condenses the laser beam 34 emitted by the laser emitting device 36. The mask 38 selectively irradiates the laser beam 34 onto a substrate 44. The reduction lens 42 is located above or below the mask 38 and reduces the laser beam 34, which passed through the mask 38, to scale.

The laser beam emitting device 36 emits an unprocessed laser beam from a light source, adjusts an energy level of the laser beam via an attenuator (not shown), and irradiates the laser beam 34 via the condenser lens 40.

An x-y stage 46 holds the substrate 44 having an a-Si thin-film deposited thereon. The x-y stage 46 is located at a location corresponding to the mask 38. At this point, to crystallize the entire substrate 44, the region being crystallized is expanded through fine relocations of the x-y stage 46.

In the configuration stated above, the mask 38 includes transmitting regions A for transmitting the laser beam 34 and blocking regions B for blocking the laser beam 34. The width of each of the blocking regions B (the distance between the transmitting regions A) determines the length of lateral growth of crystal grains.

A method of crystallizing a-Si by using the conventional SLS equipment will be described below. Generally, a crystalline silicon is formed by forming a buffer layer (not shown), which is an insulation film, on the substrate 44, forming an a-Si layer on the top surface of the buffer layer, and using the a-Si layer. The a-Si layer is generally deposited on the substrate 44 via the CVD method, where the a-Si layer contains a large amount of hydrogen. Since the hydrogen characteristically escapes from the thin-film due to heat, it is necessary to perform primary thermal processing on the amorphous preceding film for dehydrogenation. The reason for this is that the surface of a crystalline thin-film becomes significantly uneven in the case where hydrogen is not removed in advance, and thus electric characteristics thereof are significantly deteriorated.

However, by using a crystallization method using a laser beam, the entire region of a substrate 44 cannot be crystallized simultaneously. The reason for this is that the beam width of a laser beam 34 and the size of a mask 38 are limited. Therefore, crystallization is completed by aligning a single mask 38 a plurality of times and repeating a crystallization process every time the mask 38 is aligned. At this point, if a crystallized region corresponding to a reduced area of the single mask 38 is defined as one block, the one block is also crystallized by laser beam 34 irradiations performed a plurality of times.

Figure 2:
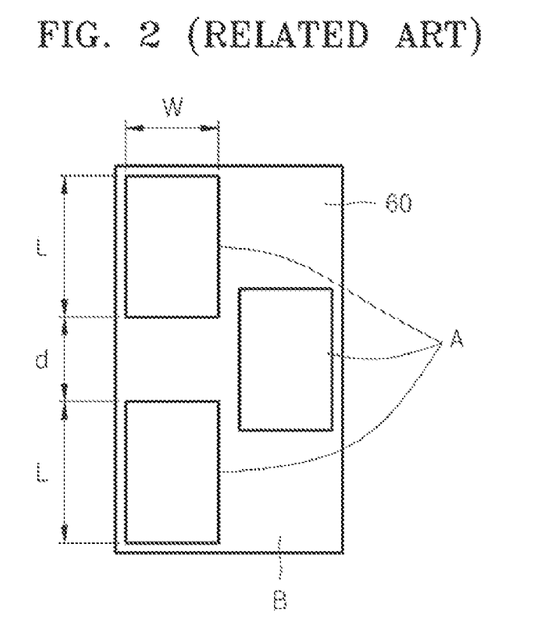
FIG. 2 is a plan view of a mask used in silicon crystallization in the related art.

FIG. 2 is a plan view of a mask 60 used in silicon crystallization. The mask 60 is configured to obtain a 2-shot effect (completion of crystallizing one block with two irradiations) by performing a crystallization process with a single scan in the x-axis direction. As shown in FIG. 2, the mask 60 includes the transmitting regions A and the blocking region B, where the transmitting regions A are arranged in the form of stripes extending in a horizontal direction. At this point, the transmitting regions A are formed in the upper and lower portions of the mask 60 at predetermined intervals apart from each other, such that one of the transmitting regions A is located adjacent to the region between the transmitting regions A formed in the upper and lower portions of the mask 60.

A length d of the region between the transmitting regions A is smaller than a length L of the transmitting region A. The three transmitting regions A shown in FIG. 2 are formed to each have the same length L. In this case, when a laser beam is irradiated to the mask 60 from the upper portion of the mask 60, crystal grains are laterally grown from two opposite interfaces of the a-Si layer in the melted region. Growth of each of the laterally grown crystal grains is stopped as grain boundaries collide with each other, where no core generation region exists between the laterally grown crystal grains. Accordingly, the 2-shot effect may be obtained by a single scan in the x-axis direction.

Figure 3A:
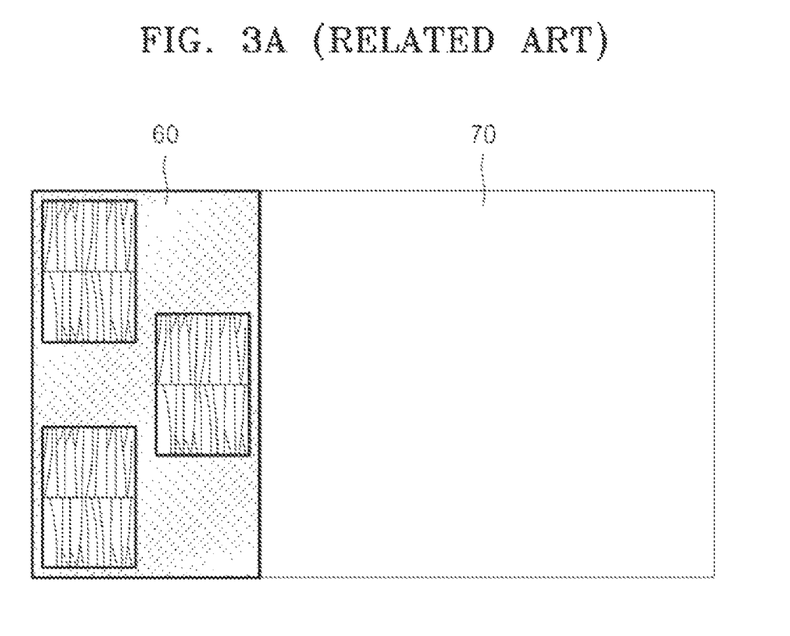
FIGS. 3A, 3B, 3C, and 3D are plan views for showing a crystallization method using the structure of a mask used in general methods of forming poly-Si thin-films.

FIGS. 3A, 3B, 3C, and 3D are plan views for showing a crystallization method using the structure of a mask used in general methods of forming poly-Si thin-films. As shown in FIG. 3A, a laser beam is irradiated onto a-Si formed on a substrate 70 while using the general mask 60 having a transmissive pattern A and a non-transmissive pattern B, and the poly-Si is formed as the a-Si is melted and solidified.

Figure 3B:
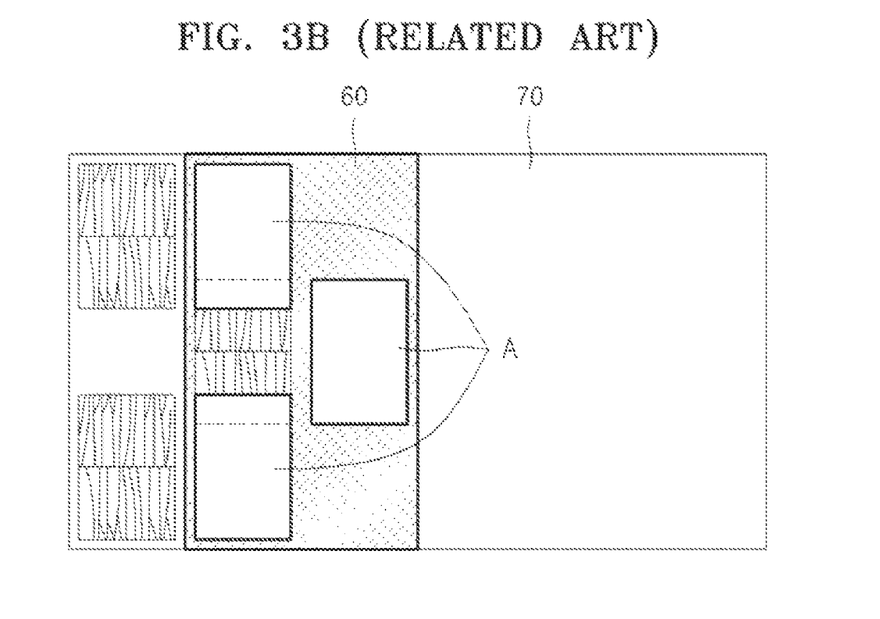
Figure 3C:
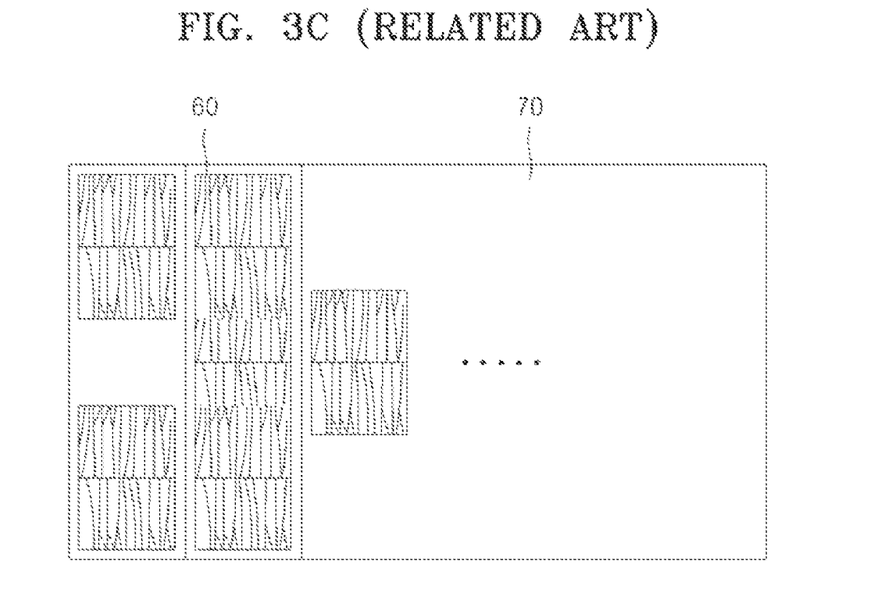

Then, as shown in FIG. 3B, when the mask 70 is shifted by a predetermined distance in the x-axis direction and the laser beam is irradiated again, poly-Si in a crystallized region at which the a-Si and a transmissive region overlap each other is melted and crystallized again as shown in FIG. 3C. In the same manner, the crystallization process is performed on poly-Si in regions where the a-Si and the transmissive regions overlap by being melted and solidified through repeated scans and laser beam irradiations.

Figure 3D:
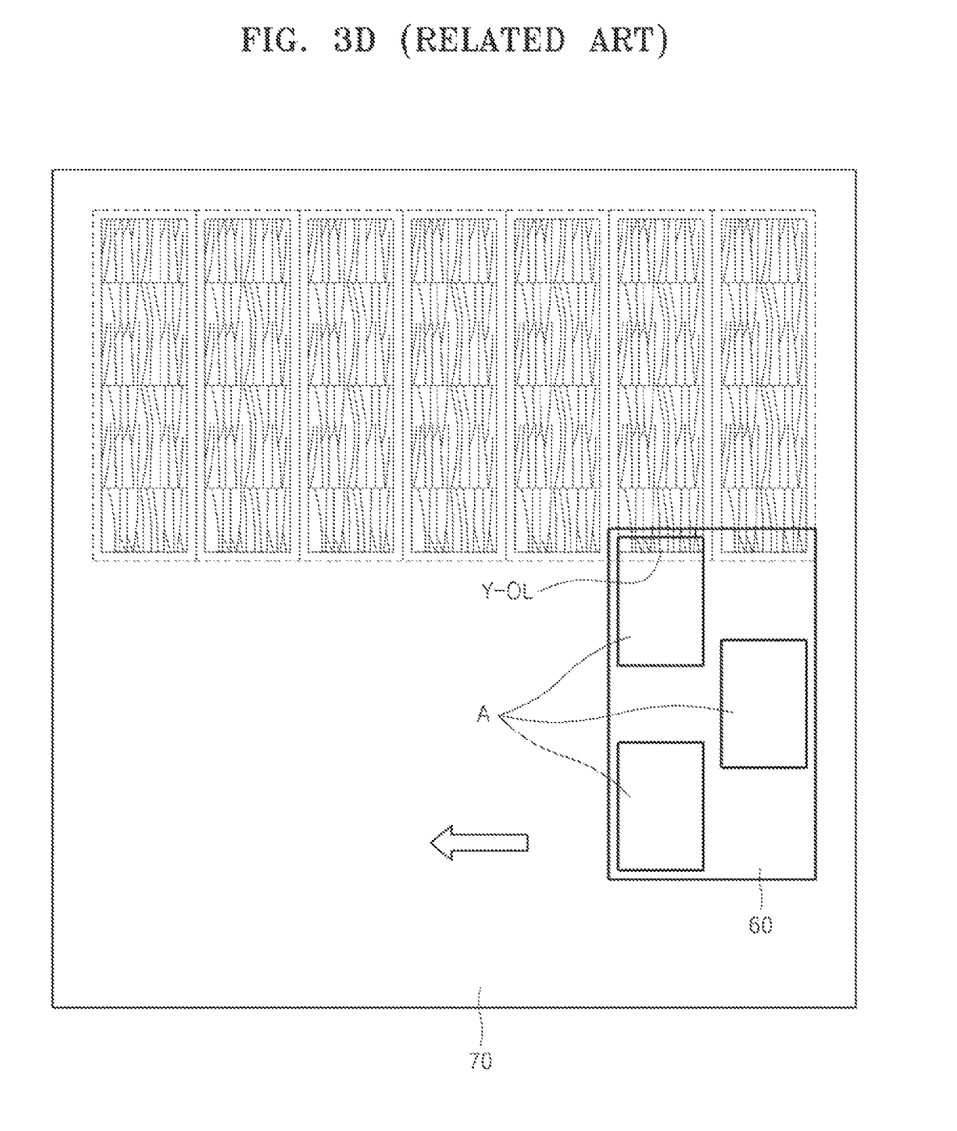

As described above, after completing crystallization in the x-axis direction by successively crystallizing the a-Si below a mask 60 by moving the mask 60 in the x-axis direction and irradiating the laser beam to the upper portion of the mask 60, the mask 60 is relocated by a predetermined distance in the y-axis direction and is moved in the x-axis direction again to crystallize a-Si.

However, in this case, for a-Si to be continuously formed in the y-axis direction, it is necessary to perform crystallization after the mask 60 is relocated in the y-axis direction such that a portion Y-OL of the transmissive region A of the mask overlaps a portion of already crystallized a-Si. In other words, the overlapping region Y-OL, where a portion of an already crystallized region in the upper portion of the a-Si and a portion of a region to be crystallized in the lower portion of the a-Si overlap each other, is inevitably formed, and as such, the overlapping region Y-OL is an uneven region deteriorating overall crystallization quality.

SUMMARY

Aspects of the present invention provides a mask for sequential lateral solidification (SLS), capable of preventing an overlapping region and a diagonal stain due to a polycrystalline silicon active layer and a SLS apparatus having the same.

According to an aspect of the present invention, there is provided a mask for sequential lateral solidification (SLS), which moves in a first direction and selectively transmits a laser beam emitted by a laser emitting device, the mask including a plurality of slits which are formed such that the width of a slit in the first direction is smaller than the width of the slit in a second direction, which is perpendicular to the first direction, wherein each of the slits is tilted by a predetermined angle with respect to the first direction.

According to an aspect of the invention, some of the slits may be formed to be longer than other slits.

According to an aspect of the invention, at least one end of each of the slits may extend out of a region to which the laser beam is irradiated.

According to an aspect of the present invention, the plurality of slits may be grouped into one or more blocks.

According to an aspect of the present invention, a total number of the slits may be an odd number.

According to another aspect of the present invention, there is provided a sequential lateral solidification (SLS) apparatus including a laser emitting device; a stage on which a substrate is mounted and to which a laser beam emitted by the laser emitting device is irradiated; and a mask for SLS of any of claims 1 through 5.

According to an aspect of the present invention, the mask for SLS may be designed to maximize the X-pitch and the Y-pitch.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 4A:
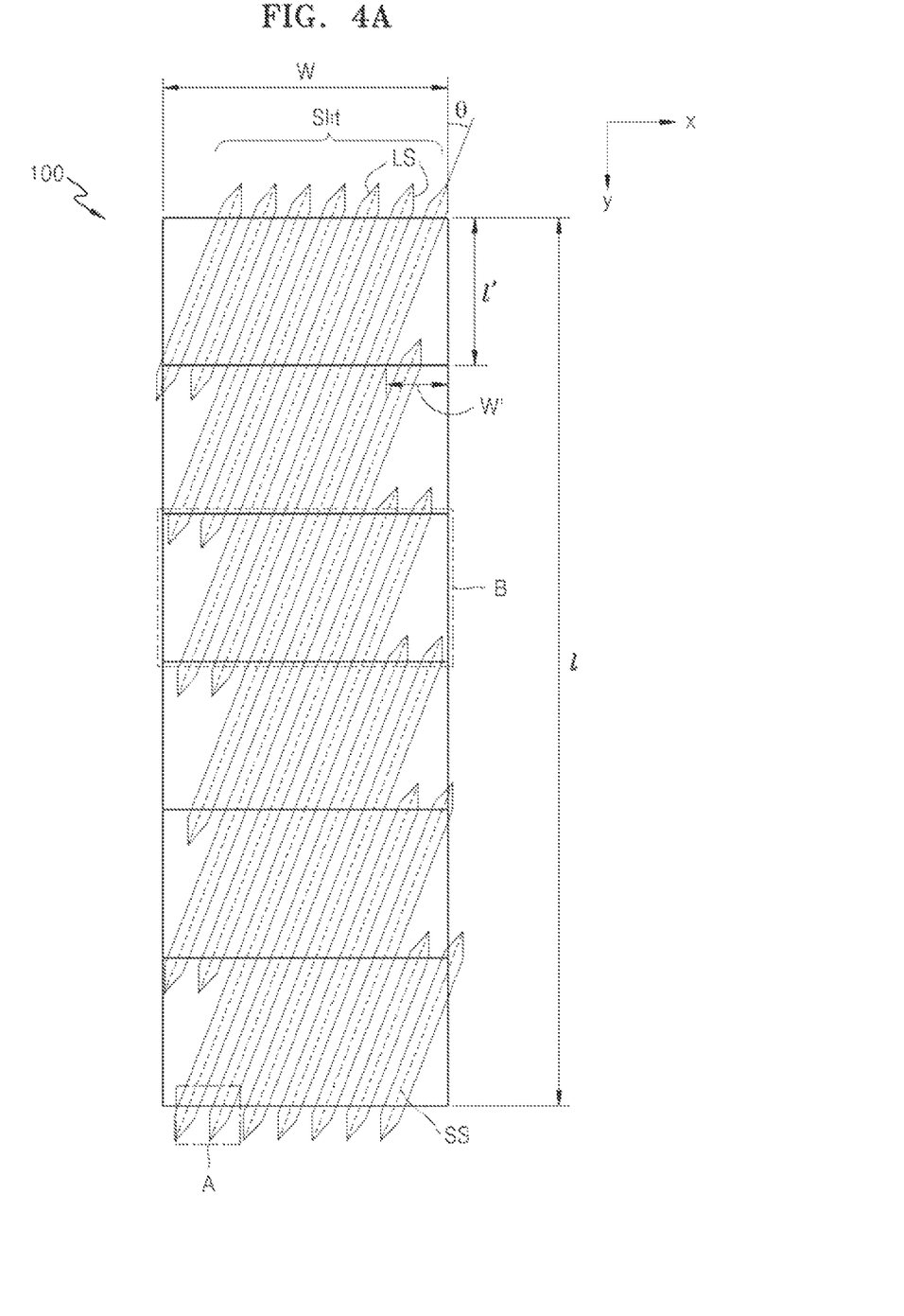
FIG. 4A is a plan view showing a configuration of a mask 100 for performing SLS according to an embodiment of the present invention.
Figure 4B:
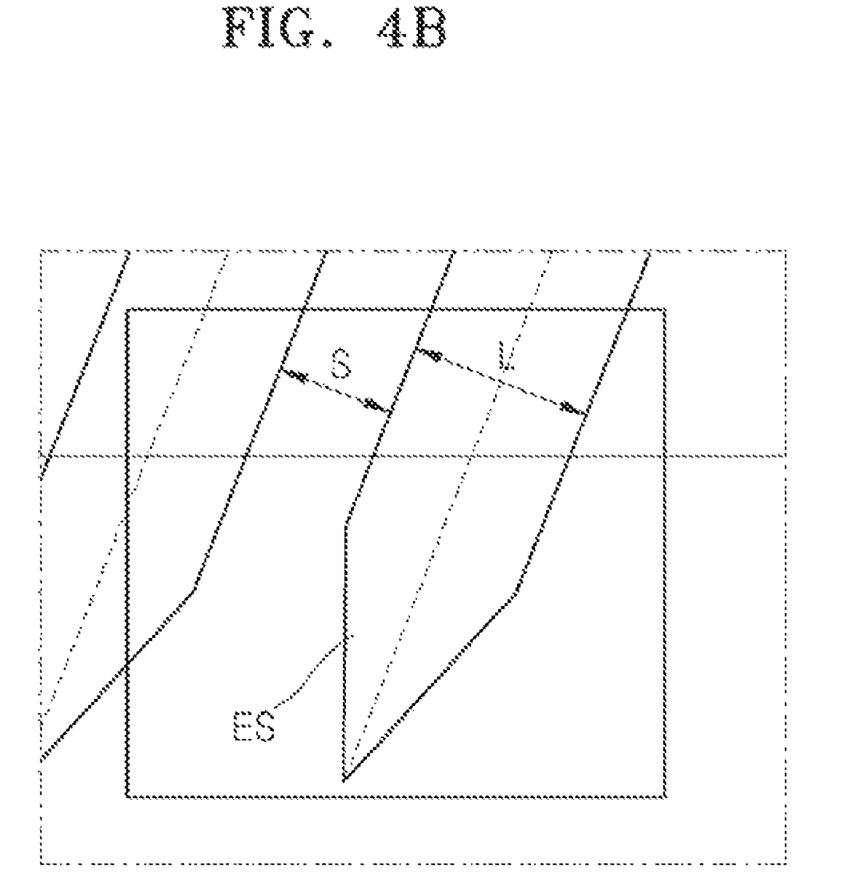
FIG. 4B is a diagram showing a portion A of FIG. 4A in more detail.

As shown in FIGS. 4A and 4B, a mask 100 for sequential lateral solidification (SLS) according to an embodiment of the present invention has a so-called vertical structure, in which the width of a slit SS, LS in a first direction, which is parallel to a scan direction of a laser beam, is smaller than the width of the slit SS, LS in a second direction, which is perpendicular to the scan direction of the laser beam. The slits SS, LS are formed in a mask body, which is held between a laser source and a substrate, such as between the laser emitting device 36 and the substrate 44 of the SLS equipment 32 of FIG. 1. FIG. 4A is a plan view showing a configuration of the mask 100, and FIG. 4B is a diagram showing a portion A of FIG. 4A in closer detail. As shown in FIGS. 4A and 4B, the mask 100 is configured such that the width of the slit SS, LS in a first direction (x-axis direction) is smaller than the width of the slit SS, LS in a second direction (y-axis direction). The first direction is parallel to a scan direction of the laser beam. The second direction is perpendicular to the scan direction of the laser beam. Furthermore, each of the slits is tilted by a predetermined angle with respect to the first direction (x-axis direction) and the second direction (y-axis direction).

As described above in relation to FIGS. 2 through 3D, a conventional mask 60 for SLS is generally configured such that the width L of a slit A in a first direction, which is parallel to the scan direction of laser beam, is longer than the width W of the slit A in a second direction, which is perpendicular to the scan direction of the laser beam. However, in this case, an overlapping region Y-OL, at which a portion of an already crystallized region in an upper portion of a-Si and a portion of a region to be crystallized in a lower portion of a-Si overlap each other, is inevitably formed.

Meanwhile, there have been attempts to form a mask having a vertical structure. However, due to pixel arrangement, thin-film transistors (TFTs) are arranged in a certain manner, and protrusions formed after SLS mask crystallization are also arranged in a certain manner. Here, one more or one less protrusions as compared to normal position may be arranged on a TFT corresponding to a particular location (a location on a diagonal line), and thus the arrangement of the protrusions varies periodically around pixels on diagonal lines. Therefore, diagonal stains may be formed.

To resolve the problem, the mask 100 is formed to have a vertical structure and each of slits of the mask is tilted by a predetermined angle with respect to the scan direction of the laser beam in aspects of the present invention. Specifically, the mask 100 for SLS includes a plurality of slits SS, LS. The width of the slit SS, LS in the first direction (x-axis direction), which is parallel to the scan direction of the laser beam, is smaller than the width of the slit SS, LS in the second direction (y-axis direction), which is perpendicular to the scan direction of the laser beam. Here, the slits SS, LS are tiled by a predetermined angle θ with respect to the second direction (y-axis direction). Furthermore, some of the slits SS, LS are long slits LS extending from the upper portion of the mask 100 to the lower portion of the mask 100. Others of the slits SS, LS are short slits SS, which are shorter than the long slits LS.

The mask 100 may be considered as being divided into a plurality of blocks B. Here, some of the blocks B include the short slits SS in one portion, whereas the remaining portion includes long slits LS. Others of the blocks B include only long slits LS. As shown, the blocks B having the short slits SS are at edges of the mask 100, but the invention is not limited thereto.

Ends ES of the slits extend out of transmissive regions of the mask 100. Accordingly, having ends ES of each of the slits SS, LS extend out of the transmissive regions of the mask 100 prevents the formation of a dead zone during crystallization due to formation of overlapping regions in the upper and lower portions of the slits, such as occurs at the overlapping regions Y-OL as shown in FIG. 3D.

The mask 100 for SLS according to an embodiment of the present invention may be designed by performing the following steps. First, variables to be used for designing a mask 100 may be defined as stated below:

L=slit width
S=distance between slits
n1=number of short slits SS
n2=number of slit blocks B
n4=total number of slits
n5=number of long slits LS
θ=tilt angle of slit
W'=width of short slit SS
W=laser beam width
l'=unit laser beam length (laser beam length corresponding to one block)
l=laser beam length The slit width L, the distance S between slits, and the tilt angle θ of slits are determined in consideration of SLS equipment, such as the SLS equipment 32 of FIG. 1. Here, the size of overlapping regions between patterns and the distance between crystallized protrusions and pattern edges vary based on the slit width L, the distance S between slits, and the tilt angle θ of slits, where the variations affect characteristics and image quality of a TFT after crystallization. In particular, the distance between crystallized protrusions and pattern edges affect characteristics of a TFT including uniformity and mobility, and may be determined in reference to appropriate margins based on desired characteristics of a device.

After determination of the slit width L, the distance S between slits, and the tilt angle θ of slits, the width W' of a short slit is calculated according to Equation 1. After the calculation of the width W' of a short slit, the unit laser beam length l' is calculated according to Equation 2.

$$W' = \frac{n1(L+S)}{\cos\theta}$$ Equation 1

$$l' = \frac{W'}{\tan\theta}$$ Equation 2

A number n2 of slit blocks B and a number n1 of short slits SS are determined. Here, the number n2 of slit blocks B and the number n1 of short slits SS are the factors related to the laser beam length l. Thus, the number n2 of slit blocks B and the number n1 of short slits SS may be determined according to a specification of a laser beam generated by a laser emitting device of the SLS equipment, such as the laser emitting device 36 of FIG. 1.

After the number n2 of slit blocks B and the number n1 of short slits SS are determined, the laser beam length l is calculated according to Equation 3. The laser beam length l may be determined according to equipment specifications.

$$l = n2 * l'$$ Equation 3

A total number n4 of slits within each block B is determined. Here, the total number n4 of slits may also be determined according to equipment specifications. After the total number n4 of slits is determined, the laser beam width W is calculated according to Equation 4.

$$W = \frac{(n1+n4)(L+S)}{\cos\theta} - S$$ Equation 4

Furthermore, a number n5 of long slits LS is calculated based on the number n1 of short slits SS and the total number n4 of slits within each block B.

Based on the calculated values, an X-pitch and a Y-pitch are calculated. By way of example, assuming the laser used in the SLS equipment (such as the SLS equipment 32 of FIG. 1) according to the present invention is a pulse-type laser, where pulses are generated 300 times per second (300 Hz) to take 300 irradiations. A distance by which a stage moves between shots is referred to as a scan pitch, where it is referred to as the X-pitch if the stage moves in the x-axis direction, and as the Y-pitch if the stage moves in the y-axis direction.

The X-pitch and the Y-pitch may be calculated according to Equation 5 and Equation 6.

$$X\text{-pitch} = \frac{n4(L+S)}{2} \qquad \text{Equation 5}$$

$$Y\text{-pitch} = l \pm \alpha \qquad \text{Equation 6}$$

If the X-pitch and the Y-pitch increase, the speed at which the stage moves also increases. Thus, an overall processing time may be reduced and a processing yield may be improved. Therefore, the mask 100 for SLS should be designed to maximize the X-pitch and the Y-pitch, although it is understood that other factors might limit the ability to design the mask 100 with the absolute maximum theoretical X and Y pitches.

Furthermore, the total number n4 of slits may be an odd number. The reason for this is that, overlapping of patterns may be prevented during actual laser irradiation only if the total number n4 of slits is an odd number, and thus overall uniformity of crystallization may be improved.

As described above, formation of overlapping regions in the y-axis direction may be prevented by arranging slits of a mask in a vertical pattern according to aspects of the invention. Furthermore, formation of diagonal stains may be prevented by tilting the slits of the mask, which are arranged in the vertical pattern, by a predetermined angle according to aspects of the invention.

Hereinafter, a method of performing crystallization by using the mask 100 for SLS as described above will be described in detail in relation to FIGS. 5 to 8. FIGS. 5 through 8 are plan views showing a method of performing crystallization by using the mask 100 for SLS according to aspects of the present invention (hereinafter, the size of the mask 100 shown in FIGS. 5 through 8 is reduced based on a reduction power of a reduction lens, and it may be assumed that a slit corresponds to a laser beam).

Figure 5:
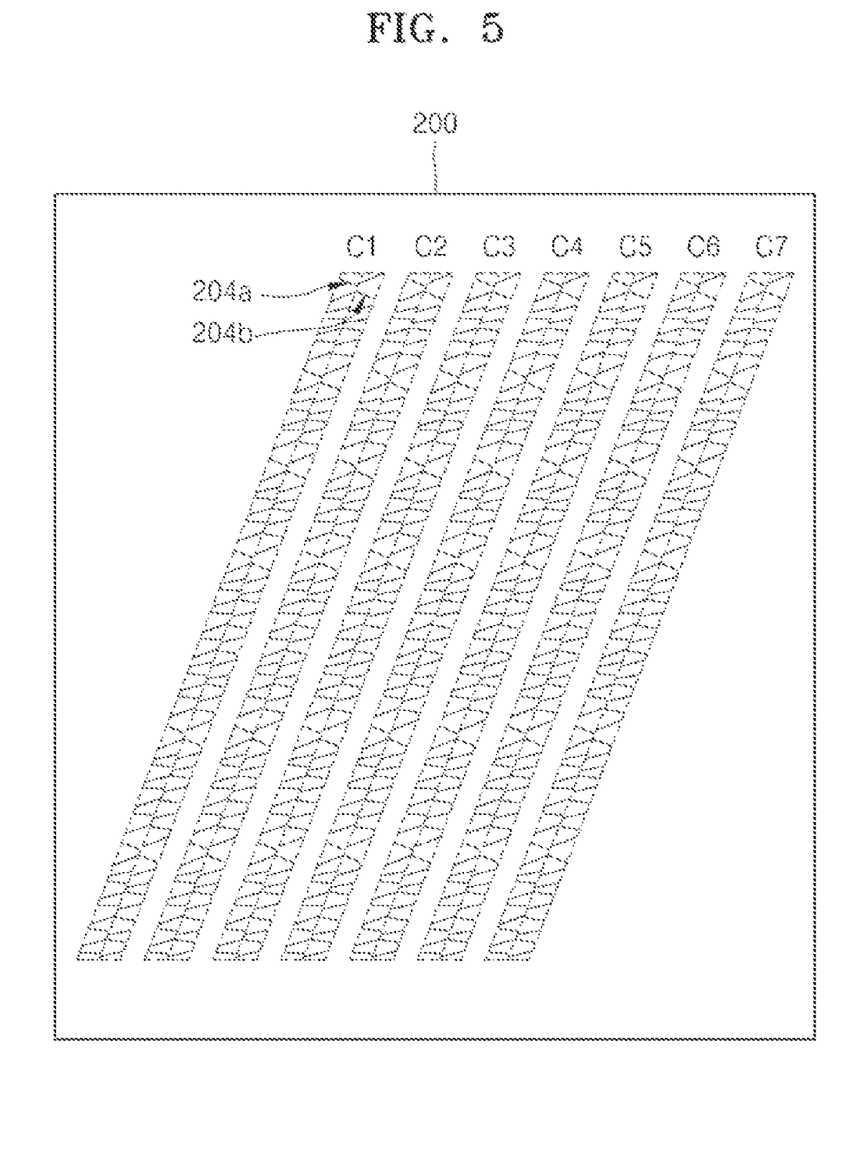
FIGS. 5 through 8 are plan views showing a method of performing crystallization by using a mask for SLS according to the present invention.

As shown in FIGS. 4A and 5, a substrate 200 on which an amorphous layer is formed is fixed to the x-y stage (such as the stage 46 of FIG. 1). The mask 100 according to the present invention is located on the substrate 200, where a reduction lens is interposed therebetween.

Next, when a laser beam is irradiated to the upper portion of the mask 100, the laser beam is transformed to have a stick-like shape via slits SS, LS of the mask 100, is reduced to scale by the reduction lens and is irradiated to the amorphous layer. Here, the laser beam is irradiated with an energy band greater than a complete melt-through energy band, and thus a region to which the laser beam is irradiated is crystallized after being completely melted.

A number of crystallized regions C1, C2, C3, C4, C5, C6, C7 are crystallized as described above. The number is the same as the number of slits SS, LS of the mask 100. Each of the crystallized regions C1, C2, C3, C4, C5, C6, C7 includes a first crystallized region 204a and a second crystallized region 204b, which include crystal grains laterally grown toward each other. Here, no discontinuous growth of crystal grains of each of the crystallized regions C1, C2, C3, C4, C5, C6, C7 occurs in the x-axis direction, in which crystal grains 204a and 204b grow.

Figure 6:
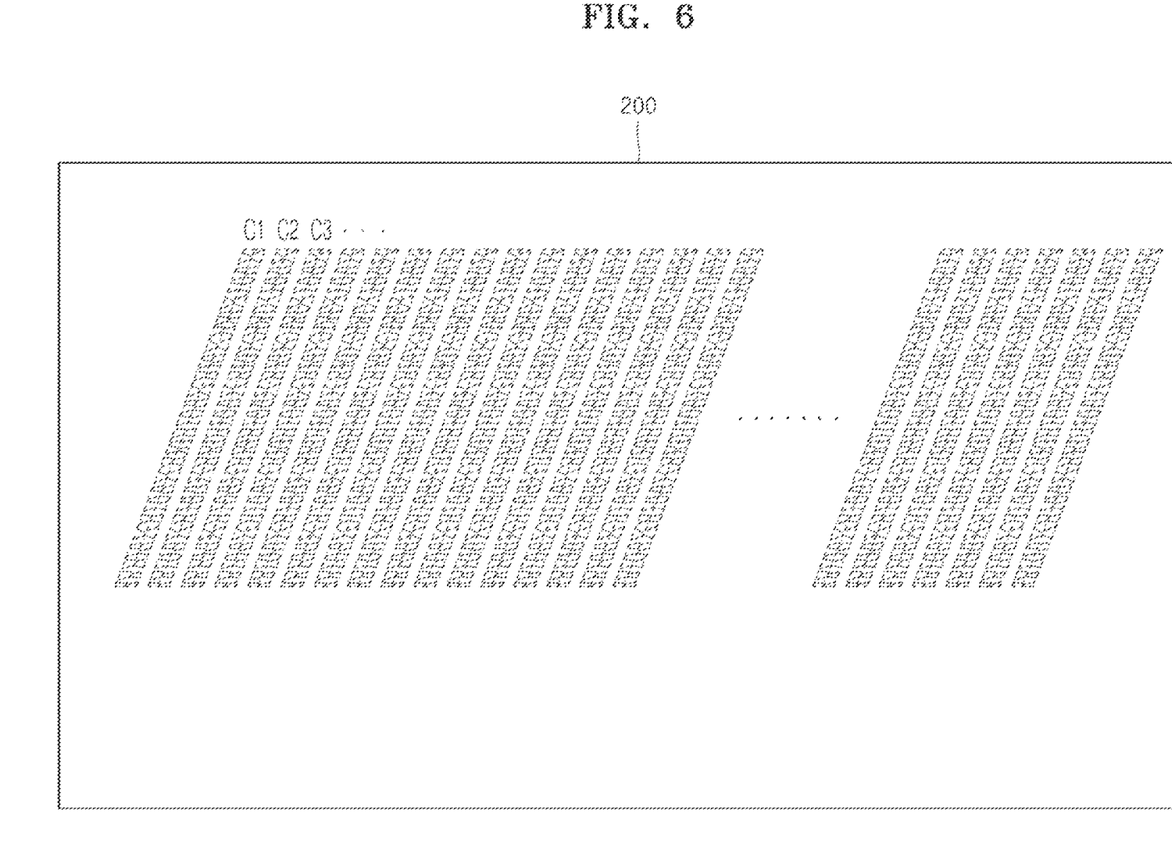

Next, as shown in FIGS. 4A and 6, after completion of crystallization through first laser beam irradiation, the x-y stage is relocated in the negative x-axis direction, where the distance by which the x-y stage is relocated corresponds to the width of the mask 100 as described above. In other words, the x-y stage is relocated by a distance of n4*(L+S), and then crystallization is performed. Through repetitive moving and scanning, each crystallization pattern is stitched together with another crystallization to form complete striped patterns across the substrate 200.

Figure 7:
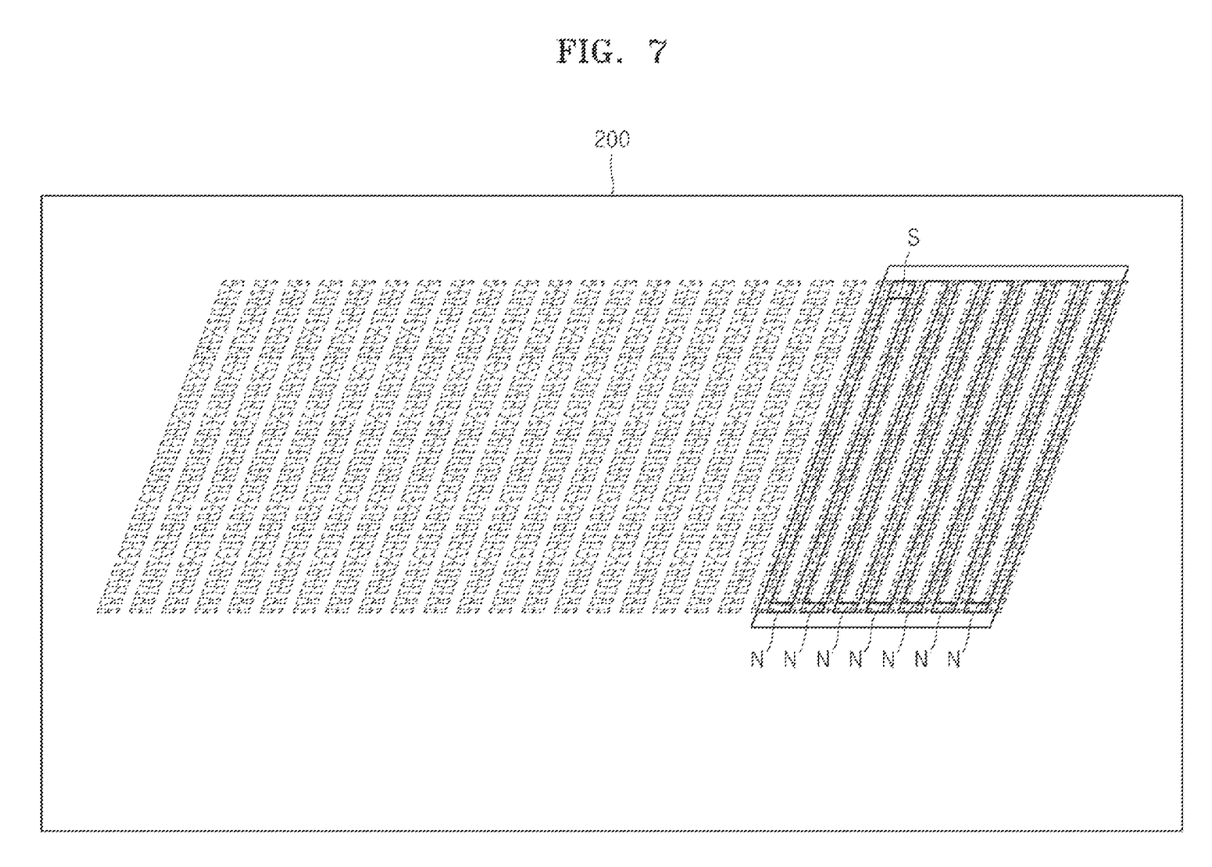

Next, as shown in FIGS. 4A and 7, after completion of crystallization through laser beam scanning in the x-axis direction, the x-y stage is not relocated again in the y-axis direction. Instead, the x-y stage is relocated by a distance of (L+S)/2 in the x-axis direction. In other words, the mask 100 is relocated by (L+S)/2 from regions C1, C2, . . . , and Cn, which are crystallized finally. Consequently, slits SS, LS of the mask 100 are located in regions N between crystallized regions (i.e., the stitched crystallization patterns).

Figure 8:
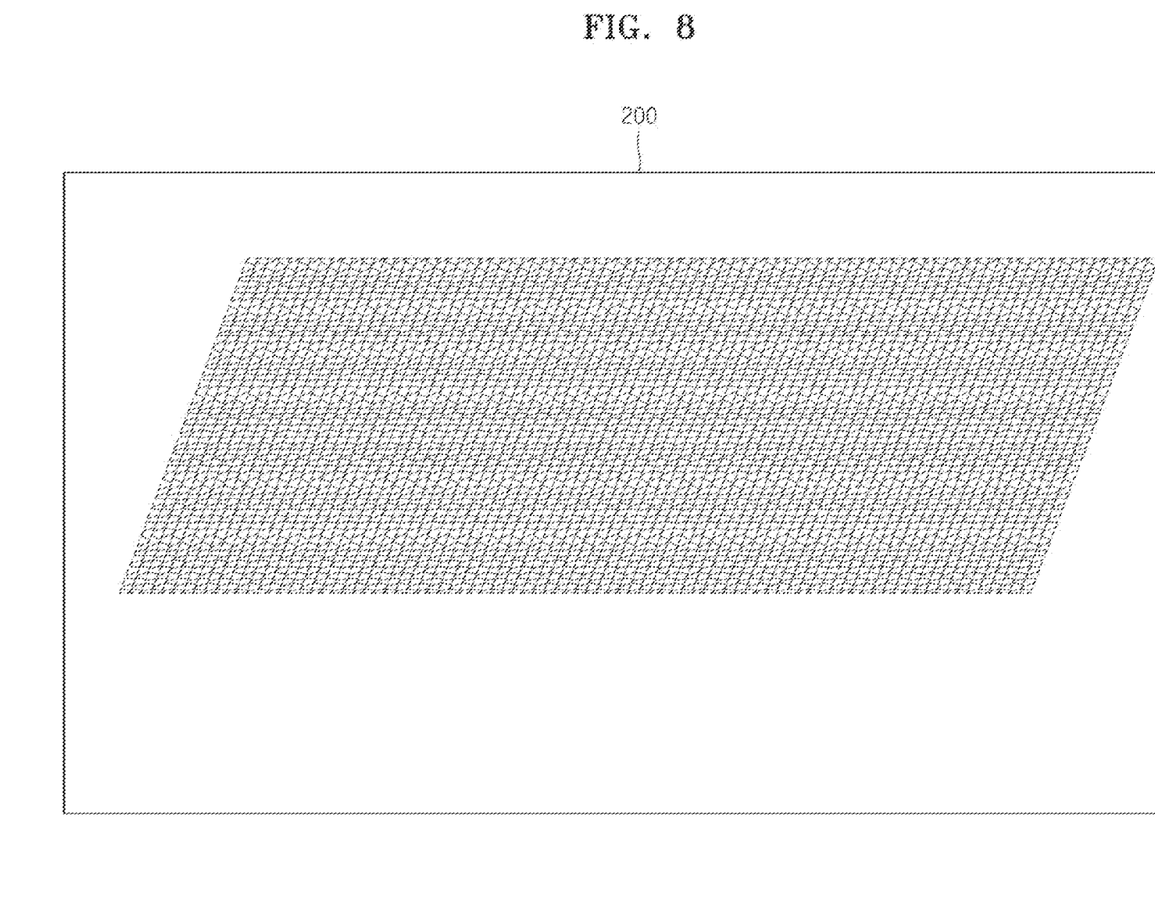

Therefore, as shown in FIG. 8, after performing of crystallization in the x-axis direction is completed, the mask 100 is relocated by (L+S)/2, and crystallization is performed by irradiating a first laser beam. Then, crystallization is performed again as moving the x-y stage by the size of the mask 100, that is, by n (L+S) in the x-axis direction. Therefore, as crystallization is performed in the x-axis direction and the negative x-axis direction, crystallization may be completed with 2 shots of laser beam irradiations. In this way, each crystallization is stitched together within the regions N to form complete striped patterns and thus forming a complete crystallization area on the substrate 200.

While described in terms of being used in the SLS equipment 32 of FIG. 1, the invention is not specifically limited thereto. For instance, the motion of the substrate 100 relative to the substrate 200 could be performed by moving the mask 100 relative to the substrate 200, and/or by using the x-y stage 46 to move the substrate 200 relative to the mask 100. Lastly, while not shown, the movement of the x-y stage 46 and/or the mask 100, as well as the timing of the irradiation of the laser beam from the laser beam emitting device 36 can be controlled by a controller. Such a controller could be implemented using one or more processors executing computer software and/or firmware encoded on a computer readable medium to implement all or portions of the method described in relation to FIGS. 5-8.

According to aspects of the present invention, formation of overlapping regions in the y-axis direction may be prevented by arranging slits of a mask in a vertical pattern. Furthermore, formation of diagonal stains may be prevented by tilting the slits of the mask, which are arranged in the vertical pattern, by a predetermined angle according to aspects of the invention.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A mask for sequential lateral solidification (SLS), which moves in a first direction and selectively transmits a laser beam emitted by a laser emitting device, the mask comprising:
 a mask body; and
 a plurality of slits extending through the mask body, a width of each slit in the first direction is smaller than a width of the slit in a second direction, which is perpendicular to the first direction,
 wherein each of the slits is tilted by a same predetermined angle with respect to the first direction.

2. The mask of claim 1, wherein some of the slits are formed to be longer than others of the slits.

3. The mask of claim 1, wherein at least one end of each of the slits extends out of a region to which the laser beam is irradiated.

4. The mask of claim 1, wherein the plurality of slits are grouped into one or more blocks.

5. The mask of claim 1, wherein a total number of the slits is an odd number.

6. A sequential lateral solidification (SLS) apparatus for use in forming crystallization patterns on a substrate, the apparatus comprising:
- a laser emitting device;
- a stage on which the substrate is mounted and to which a laser beam emitted by the laser emitting device is irradiated; and
- the mask for SLS of claim 1 disposed between the laser emitting device and the substrate such that the emitted laser beam passes through the slits.

7. The SLS apparatus of claim 6, wherein the mask for SLS is designed to maximize an X-pitch and a Y-pitch.

8. The SLS apparatus of claim 6, wherein some of the slits are formed to be longer than other slits.

9. The SLS apparatus of claim 8, wherein the mask for SLS is designed to maximize an X-pitch and a Y-pitch.

10. The SLS apparatus of claim 6, wherein at least one end of each of the slits extends out of a region to which the laser beam is irradiated.

11. The SLS apparatus of claim 10, wherein the mask for SLS is designed to maximize an X-pitch and a Y-pitch.

12. The SLS apparatus of claim 6, wherein the plurality of slits are grouped into one or more blocks.

13. The SLS apparatus of claim 12, wherein the mask for SLS is designed to maximize an X-pitch and a Y-pitch.

14. The SLS apparatus of claim 6, wherein a total number of the slits is an odd number.

15. The SLS apparatus of claim 14, wherein the mask for SLS is designed to maximize an X-pitch and a Y-pitch.

* * * * *